United States Patent [19]

Graul et al.

[11] 4,045,251

[45] Aug. 30, 1977

[54] PROCESS FOR PRODUCING AN INVERSELY OPERATED TRANSISTOR

[75] Inventors: Jüergen Graul, Gruenwald; Helmuth Murrmann, Ottobrunn, both of Germany

[73] Assignee: Siemens Aktiengesellschaft, Berlin & Munich, Germany

[21] Appl. No.: 654,616

[22] Filed: Feb. 2, 1976

[30] Foreign Application Priority Data

Feb. 21, 1975 Germany .............................. 2507613

[51] Int. Cl.² ............................................ H01L 21/26
[52] U.S. Cl. ...................................... 148/1.5; 148/187
[58] Field of Search ............................ 148/1.5, 187

[56] References Cited

U.S. PATENT DOCUMENTS

| | | | |
|---|---|---|---|
| 3,383,567 | 5/1968 | King et al. | 148/1.5 X |
| 3,745,070 | 7/1973 | Yada et al. | 148/1.5 |
| 3,756,862 | 9/1973 | Ahn et al. | 148/1.5 |
| 3,856,578 | 12/1974 | Payne et al. | 148/1.5 |
| 3,891,468 | 6/1975 | Ito et al. | 148/1.5 |
| 3,897,276 | 7/1975 | Kondo | 148/1.5 |

*Primary Examiner*—G. Ozaki
*Attorney, Agent, or Firm*—Hill, Gross, Simpson, Van Santen, Steadman, Chiara & Simpson

[57] ABSTRACT

A process for producing an inversely operated transistor in a body of semiconductor material which has arranged on its surface collector, base and emitter zones and wherein the base is doped by ion implantation so that minority charge carriers injected from the emitter zone into the base zone are accelerated in the direction towards the collector zone due to an inner drift field in the base zone.

2 Claims, 5 Drawing Figures

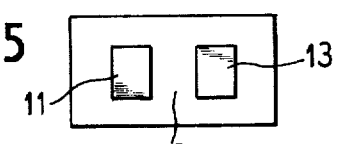
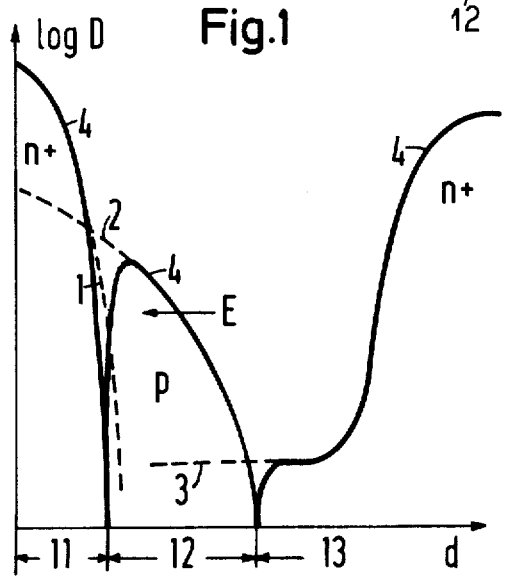
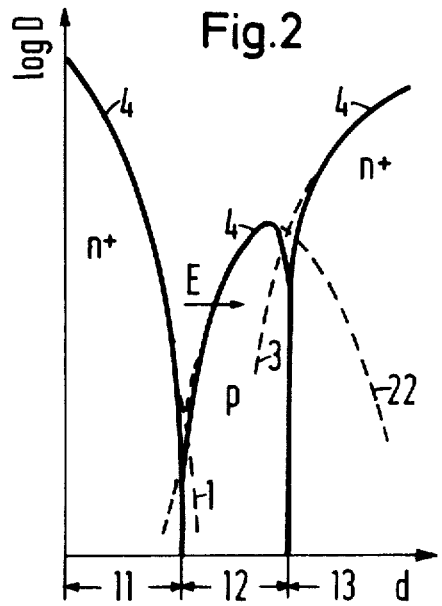
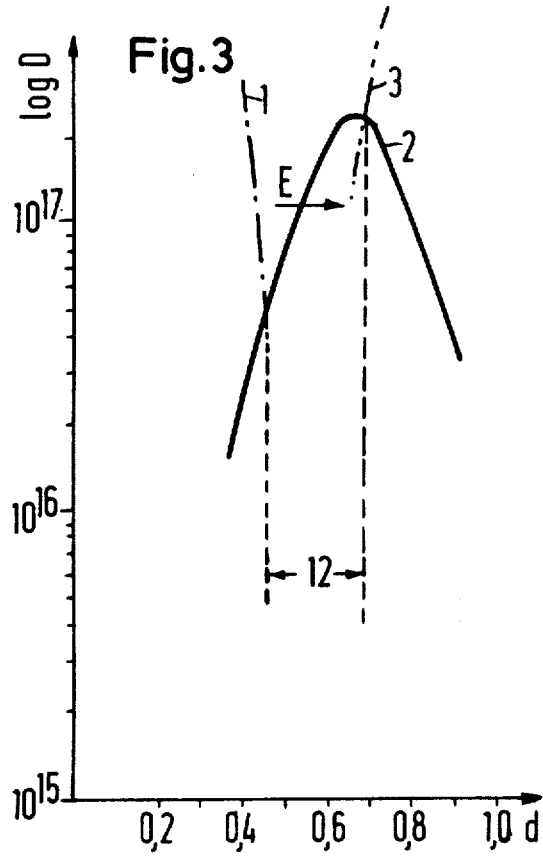
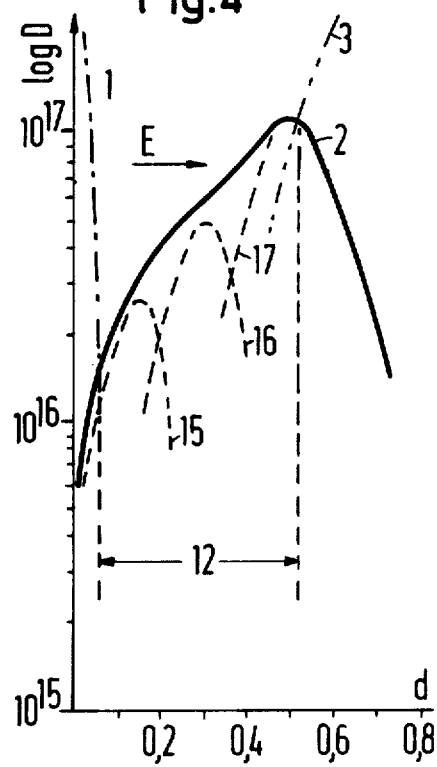

PROCESS FOR PRODUCING AN INVERSELY OPERATED TRANSISTOR

BACKGROUND OF THE INVENTION

1. Field of the Invention

This invention relates in general to process for producing inversely operated transistors in a semiconductor body.

2. Description of the Prior Art

In transistors the charge carriers injected from the emitter zone diffuse through the base zone to the collector zone. This process can be accelerated by an internal electric field in the base zone which is called the "drift field". The magnitude of the drift speed of a charge carrier is proportional to the degree of the field strength. In the case of an electron the acceleration takes place in a direction opposite to the field direction whereas in the case of a positive hole it takes place in the field direction.

In transistors produced by the conventional planar technique by the diffusion process result in doping gradients in the base zone which cause drift fields that drive injected carrier charges from the surface zone of the semiconductor body into the interior of the semiconductor body. In a normally operated transistor the injected charged carriers are accelerated from the emitter zone to the collector zone. On the other hand in the case of an inversely operated transistor such as in the case of a transistor in the so-called "MTL or I²L technique" (Merged-Transistor-Logic, and Integrated-Injection-Logic), the drift field produces a deceleration of the diffusing charge carriers as the injected charge carriers are diffused from the interior of the semiconductor body towards its surface. The result is an increase in base transit time and, thus, a possible reduction in switching speeds.

SUMMARY OF THE INVENTION

The drift field E is based on a doping gradient in the base zone and is governed in terms of direction and magnitude by:

$$E = +C \frac{1}{N_D} \cdot \frac{dN_D}{dx}$$

for a n-doped base zone and by $$E = -C \frac{1}{N_A} \cdot \frac{dN_A}{dx}$$

for a p-doped base zone, where
  $N_D$ = density of the donors
  $N_A$ = density of the acceptors,
  $C, C'$ = constants > O,
and $N_D$ and $N_A >> n$ (density of the charge carriers in the case of self-conductance).

The aim of the present invention is to provide a process for the production of an inversely operated transistor where the doping gradient in the base zone is such that the base transit time is reduced.

This object of the invention is realized in accordance with the invention by providing that the base zone is doped by ion implantation in a manner such that the minority charge carriers injected from the emitter zone into the base zone are accelerated toward the collector zone as a result of an internal drift field in the base zone.

It is known that the doping concentration of implanted ions basically follows a Gaussian distribution with the dispersion increasing in proportion to the increase in penetration depth and, thus, in implantation energy. By the selection of suitable implantation parameters (such as energy and dosage of the implanted ions as well as the application of additional layers such as, for example, oxide or nitride layers to the surface of the semiconductor body prior to the implantation,) it is possible to produce in the base zone doping profiles which possess a negative concentration gradient in the direction from the interior of the semiconductor body toward the surface of the semiconductor body, which produces a drift field which possesses the desired properties of the invention.

Ions can be implanted into the base zone in one step or in several steps. In addition the process in accordance with the invention is suitable for the production of npn or pnp transistors.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which

BRIEF DESCRIPTION OF THE DRAWINGS

FIG. 1 illustrates the doping profile of a conventional inversely operated transistor, FIG. 2 illustrates the doping profile of an inversely operated transistor produced by the process of the invention, FIG. 3 illustrates the doping profile of another inversely operated transistor produced by the process of the invention, FIG. 4 illustrates a doping profile of an inversely operated transistor produced by the process of the invention utilizing three implantation steps, and FIG. 5 is a top plan view of a transistor produced by the methods of the invention.

DESCRIPTION OF THE PREFERRED EMBODIMENTS

In FIGS. 1 through 4 the penetration depth d in micro meters is plotted along the abscissa and the logarithm of the doping concentration D (cm$^{-3}$) is plotted along the ordinate.

In FIG. 1 is a plot of the diffusion profile 1 of an n+doped collector zone of an inversely operated transistor. Curve 2 is the diffusion profile curve of the p-doped base zone and curve 3 is the diffusion profile of the n+doped emitter zone and curve 4 is the resultant overall profile. For improved clarity the diffusion profiles have been represented in broken lines. It is to be noted that with increasing penetration depth the collector zone 11, the base zone 12 and the emitter zone 13 are obtained.

As a result of the overall drop and doping concentration which occurs with increasing penetration depth in the base zone 12 a drift field E (shown by the arrow E) which decelerates the charge carriers diffusing from the emitter zone 13 to the collector zone 11 is formed.

However, if the base zone is not produced by diffusion but by implantation, the diffusion and implantation profiles and in fact the overall profile is as shown in FIG. 2. In this case, the base zone 12 of the transistor is formed by an implanted doping profile 22 (represented by broken line) which has a Gaussian distribution. However, the overall profile particularly in the base zone 12 has a characteristic which produces a drift field E which drives the charge carriers from the n+doped emitter zone 13 toward the collector zone 11. Note, for example, that the base characteristic has moved away from the collector characteristic and that the drift field E in FIG. 2 has reversed direction relative to the drift field E in FIG. 1.

FIGS. 3 and 4 represent, respectively, the doping profiles in the base zone 12 of two inversely operated transistors. Boron has been provided as the doping material for each of these base zones. In FIG. 3 the collector zone has a penetration depth of approximately 0.4 micro meters. The base width amounts to approximately 0.3 micro meters. The doping concentration maximum of the implanted boron ions amounts to approximately 2 times $10^{17}/cm^3$ with a penetration depth of approximately 0.7 micro meters. This requires an implanation energy of approximately 300 keV.

FIG. 4 is a plot of the doping concentration in the base zone for an inversely operated transistor with an extremely flat penetration depth of the collector zone. In this embodiment the base zone is between 0.05 and 0.5 micro meters and a doping concentration maximum of the base zone has a reduced penetration depth and in fact mounts to $10^{17}/cm^3$. In order to insure a sufficient doping concentration in the part of the base zone which adjoins the collector zone and to also produce the desired drift field between the emitter and collector, the base is produced by using at least three implanation steps at different energy levels. These energy levels are, for example, 50KeV as shown by broken line curve 15, 100KeV as shown by the broken line curve 16 and 200keV as shown by the broken line curve 17. The three implantation steps at different energy levels form the total implanatation profile of the base zone 12 as shown in FIG. 4.

It is to be particularly noted that in both cases FIGS. 3 and 4 the drift field E is produced which accelerates the charge carriers injected from the emitter zone 13 in the direction toward the collector zone II and thus leads to a reduced base transit time and consequently to a higher switching speed as compared to prior art transistors as illustrated in FIG. 1.

Although the invention has been described with respect to preferred embodiments it is not to be so limited as changes and modifications may be made therein which are within the full intended scope as defined by the appended claims.

We claim as our invention:

1. A process for the production of an inversely operated transistor in a semiconductor body on the surface of which are formed in spaced arrangement, collector region, then a base region and an emitter region wherein said base region is doped by ion implantation in such a manner that minority charge carriers injected from the emitter region into the base region are accelerated in the direction towards the collector region as a result of an inner drift field in the base region, wherein the ion implantation of the base region is accomplished in one step and wherein so as to dope the base region with a doping concentration of approximately $2 \cdot 10^{17}/cm^3$ in the vicinity of the emitter region, and wherein said base region has dimensions between 0.7 um and 0.4 um, an implantation energy level of approximately 300 keV is used.

2. A process for the production of an inversely operated transistor in a semiconductor body on the surface of which are formed in spaced arrangement, collector region, then a base region and an emitter region wherein said base region is doped by ion implantation in such a manner that minority charge carriers injected from the emitter region into the base region are accelerated in the direction towards the collector region as a result of an inner drift field in the base region, wherein the ion implantation of the base zone is accomplished in several different steps, and wherein the base zone is doped with a doping concentration of approximately $10^{17}/cm^3$, in the vicinity of the emitter zone, and the base zone has dimensions between 0.5 um and 0.05 um, and wherein implantation energy levels of 200 keV, 100 keV and 50 keV are used for the ion implantation.

* * * * *